US010903334B2

(12) United States Patent
Hsiao et al.

(10) Patent No.: US 10,903,334 B2
(45) Date of Patent: Jan. 26, 2021

(54) HIGH VOLTAGE SEMICONDUCTOR DEVICE AND MANUFACTURING METHOD THEREOF

(71) Applicant: UNITED MICROELECTRONICS CORP., Hsin-Chu (TW)

(72) Inventors: Shih-Yin Hsiao, Chiayi County (TW); Kuan-Liang Liu, Hsinchu County (TW); Ching-Chung Yang, Hsinchu (TW); Ping-Hung Chiang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/813,768

(22) Filed: Mar. 10, 2020

(65) Prior Publication Data

US 2020/0212201 A1 Jul. 2, 2020

Related U.S. Application Data

(62) Division of application No. 15/352,558, filed on Nov. 15, 2016, now Pat. No. 10,629,697.

(30) Foreign Application Priority Data

Oct. 21, 2016 (CN) .......................... 2016 1 0917428

(51) Int. Cl.
*H01L 29/66* (2006.01)
*H01L 29/423* (2006.01)
*H01L 29/78* (2006.01)
*H01L 29/06* (2006.01)

(52) U.S. Cl.
CPC .... *H01L 29/66545* (2013.01); *H01L 29/0653* (2013.01); *H01L 29/4238* (2013.01); *H01L 29/42376* (2013.01); *H01L 29/66621* (2013.01); *H01L 29/7834* (2013.01)

(58) Field of Classification Search
CPC combination set(s) only.
See application file for complete search history.

(56) References Cited

U.S. PATENT DOCUMENTS

| 4,992,388 A | 2/1991 | Pfiester |
| 5,342,796 A | 8/1994 | Ahn |
| 5,480,823 A | 1/1996 | Hsu |
| 5,814,544 A | 9/1998 | Huang |

(Continued)

OTHER PUBLICATIONS

Chen, the specification, including the claims, and drawings in the U.S. Appl. No. 14/727,875, filed Jun. 2, 2015.

*Primary Examiner* — Telly D Green
(74) *Attorney, Agent, or Firm* — Winston Hsu

(57) ABSTRACT

A high voltage semiconductor device and a manufacturing method thereof are provided in the present invention. A recess is formed in a semiconductor substrate, and a gate dielectric layer and a main gate structure are formed in the recess. Therefore, the high voltage semiconductor device formed by the manufacturing method of the present invention may include the main gate structure lower than a top surface of an isolation structure formed in the semiconductor substrate. Problems about integrated manufacturing processes of the high voltage semiconductor device and other kinds of semiconductor devices when the gate structure is relatively high because of the thicker gate dielectric layer required in the high voltage semiconductor device may be improved accordingly.

7 Claims, 8 Drawing Sheets

(56) References Cited

U.S. PATENT DOCUMENTS

| | | |
|---|---|---|
| 6,465,842 B2 | 10/2002 | Nishinohara |
| 6,512,265 B2 | 1/2003 | Numazawa |
| 9,391,196 B1 | 7/2016 | Chang |
| 9,722,072 B2 | 8/2017 | Chang |
| 2017/0025531 A1 | 1/2017 | Chang |

HIGH VOLTAGE SEMICONDUCTOR DEVICE AND MANUFACTURING METHOD THEREOF

CROSS REFERENCE TO RELATED APPLICATIONS

This application is a division of application Ser. No. 15/352,558 filed on Nov. 15, 2016, now allowed, which is incorporated by reference herein in its entirety.

BACKGROUND OF THE INVENTION

1. Field of the Invention

The present invention relates to a semiconductor device and a manufacturing method thereof, and more particularly, to a high voltage semiconductor device and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, in the integrated manufacturing process of the integrated circuit, there may be problems when a gate oxide layer of the LDMOS transistor device has to become thicker for electrical requirements because a gate structure formed on the gate oxide layer may become too high accordingly, and the height difference between the gate structure of the LDMOS transistor device and gate structures of the other semiconductor devices (such as low voltage transistor devices) formed on the same wafer will become significant. Accordingly, there may be problems for other related manufacturing processes, such as a planarization process, and the production yield will be affected too. Additionally, the length of the gate structure of the LDMOS transistor device has to be increased for the requirements of some specific products, and a dishing issue may occur in the chemical mechanical polishing (CMP) process performed to the gate structure with a relatively larger area especially when the gate structure of the LDMOS transistor device is made of metal materials, such as aluminum. The electrical characteristics of the LDMOS transistor device will be influenced accordingly, and the problems described above have to be improved.

SUMMARY OF THE INVENTION

A high voltage semiconductor device and a manufacturing method thereof are provided in the present invention. A main gate structure may be lower than a top surface of isolation structures in a semiconductor substrate by forming a recess in the semiconductor substrate and forming a gate dielectric layer and the main gate structure in the recess in the recess. Accordingly, related manufacturing issues caused by a thicker gate dielectric layer required for a high voltage semiconductor device may be avoided, and the purpose of enhancing the manufacturing yield may be achieved.

According to an embodiment of the present invention, a high voltage semiconductor device is provided. The high voltage semiconductor device includes a semiconductor substrate, two isolation structures, a gate dielectric layer, a main gate structure, and two sub gate structures. The two isolation structures are disposed in the semiconductor substrate. The gate dielectric layer is disposed between the two isolation structures. The gate dielectric layer is lower than a top surface of each of the isolation structures. The main gate structure is disposed on the gate dielectric layer. The main gate structure is lower than the top surface of each of the isolation structures. Each of the sub gate structures is partly disposed on the main gate structure and partly disposed on one of the two isolation structures.

According to an embodiment of the present invention, a high voltage semiconductor device is provided. The high voltage semiconductor device includes a semiconductor substrate, two isolation structures, a gate dielectric layer, and a main gate structure. The two isolation structures are disposed in the semiconductor substrate. The gate dielectric layer is disposed between the two isolation structures. The gate dielectric layer is lower than a topmost surface of each of the isolation structures. The main gate structure is disposed on the gate dielectric layer and the two isolation structures. The main gate structure is lower than the topmost surface of each of the isolation structures.

According to an embodiment of the present invention, a manufacturing method of a high voltage semiconductor device is provided. The manufacturing method includes the following steps. A semiconductor substrate is provided. Two isolation structures are formed in the semiconductor substrate. A recess is formed in the semiconductor substrate. A gate dielectric layer is formed in the recess of the semiconductor substrate. A main gate structure is formed on the gate dielectric layer. The main gate structure is lower than a top surface of each of the isolation structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of the high voltage semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
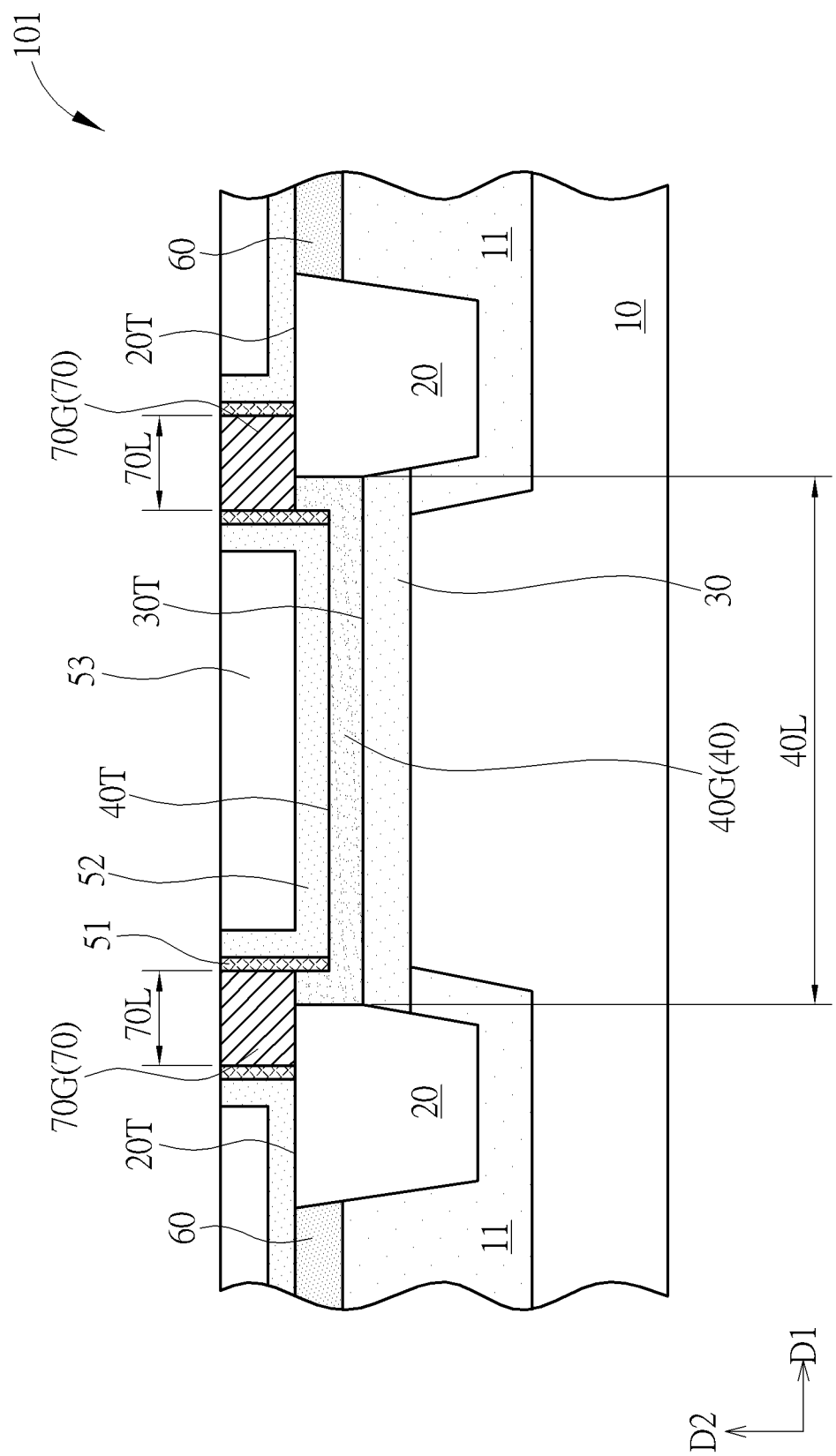
FIG. 1 is a schematic drawing illustrating a high voltage semiconductor device according to a first embodiment of the present invention.
Figure 2:
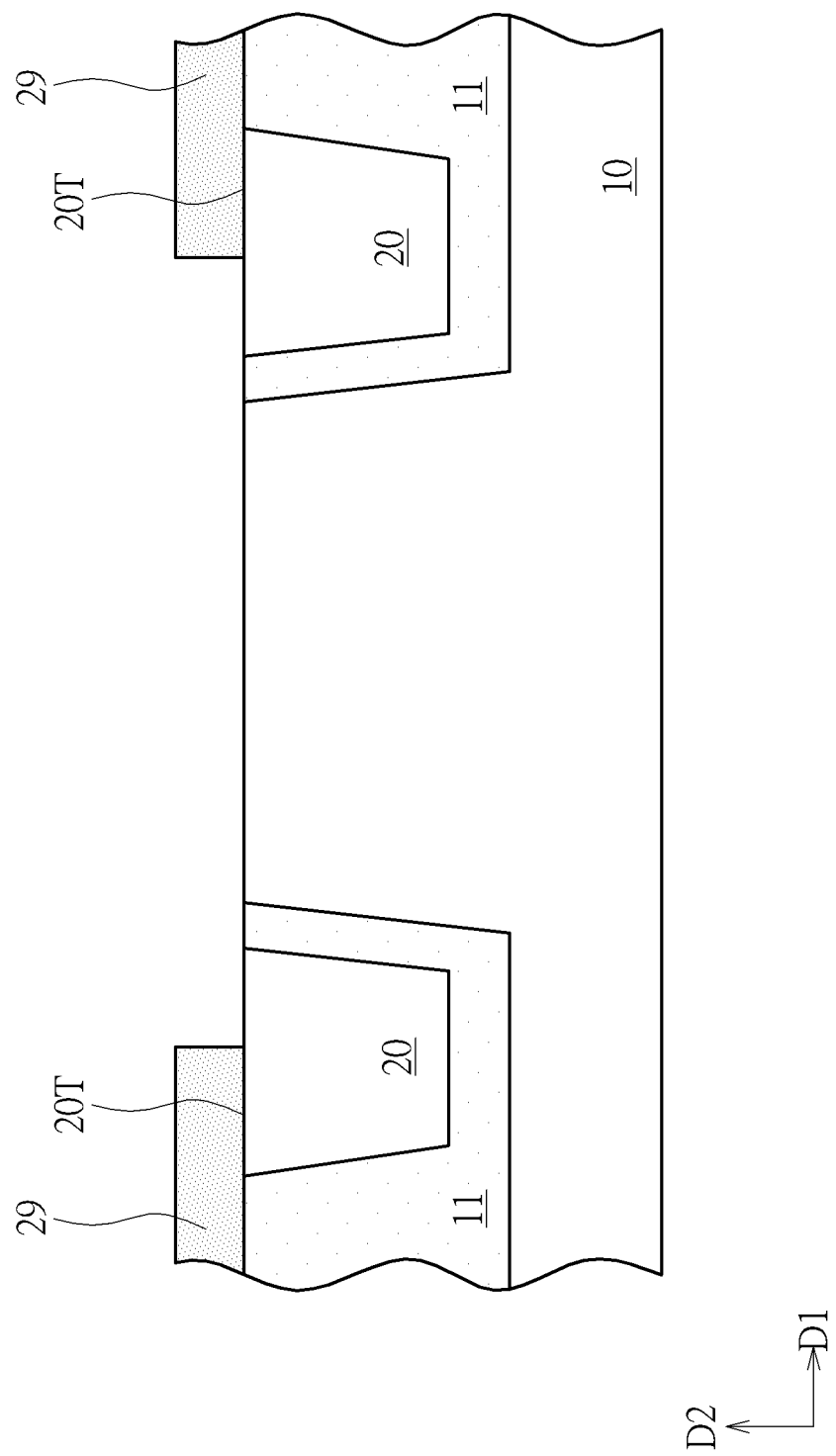

Please refer to FIG. 1. FIG. 1 is a schematic drawing illustrating a high voltage semiconductor device according to a first embodiment of the present invention. As shown in FIG. 1, a high voltage semiconductor device 101 is provided in this embodiment. The high voltage semiconductor device 101 includes a semiconductor substrate 10, two isolation structures 20, a gate dielectric layer 30, a main gate structure 40G and two sub gate structures 70G The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The two isolation structures 20 are disposed in the semiconductor substrate 10. The isolation structure 20 may include a shallow trench isolation (STI) structure, and the isolation structure 20 may be formed by forming a trench in the semiconductor substrate 10 and filling the trench with an insulation material, but not limited thereto. For example, in some embodiments, the isolation structure 20 may also be a field oxide formed by a local oxidation of silicon (LOCOS) or other suitable insulation structures. Additionally, two drift regions 11 may be formed in the semiconductor substrate 10, and the two isolation structures 20 may be formed in the two drift regions 11 respectively. The drift regions 11 may include doped well regions formed by an implantation process, for example. In some embodiments, the semiconductor substrate 10 may have a first conductivity type or include a first conductivity type region preferably, the drift regions 11 may have a second conductivity type preferably, and the first conductivity type is complementary to the second conductivity type. For example, in this embodiment, the first conductivity type may be P-type and the second conductivity type may be N-type, but not limited thereto. In other words, the semiconductor substrate 10 may be a P-type semiconductor substrate or a semiconductor substrate including a P-type well, and the drift regions 11 may be N-type well regions, but not limited thereto.

The gate dielectric layer 30 is disposed between the two isolation structures 20 in a first direction D1, and the gate dielectric layer 30 is lower than a top surface of each of the isolation structures 20, such as a first top surface 20T shown in FIG. 1. In this embodiments, any part of the gate dielectric layer 30, such as a top surface of the gate dielectric layer 30 (a second top surface 30T shown in FIG. 1, for example), is located under a horizontal level of the top surface of the isolation structure 20 in a vertical direction (such as a second direction D2 shown in FIG. 1). The gate dielectric layer 30 may include an oxide dielectric layer or dielectric layers formed by other suitable materials. The main gate structure 40G is disposed on the gate dielectric layer 30, and the main gate structure 40G is lower than the first top surface 20T of each of the isolation structures 20. For example, at least a part of a top surface of the main gate structure 40G (such as a third top surface 40T shown in FIG. 1) is lower than the first top surface 20T of each of the isolation structures 20 in the second direction D2. Additionally, in some embodiments, any part of the main gate structure 40G (including the topmost surface of the main structure 40G) is located under a horizontal level of the first top surface 20T of the isolation structure 20 in the second direction D2. Each of the sub gate structures 70G is partly disposed on the main gate structure 40G and partly disposed on one of the two isolation structures 20. Specifically, the two sub gate structures 70G are disposed at two opposite ends of the main gate structure 40G in the first direction D1 respectively, and the two sub gate structures 70G are also disposed on the two isolation structures disposed on two sides of the main structures 40G in the first direction D1 respectively.

In some embodiments, a material of the main gate structure 40G may be different from a material of the sub gate structures 70G For example, the main gate structure 40G may include a polysilicon gate structure, and each of the sub gate structures 70G may include a metal gate structure, but not limited thereto. Additionally, a length of the main gate structure 40G in the first directionD1 (such as a first length 40L shown in FIG. 1) is larger than a length of each of the sub gate structures 70G in the first direction D1 (such as a second length 70L shown in FIG. 1) preferably, but not limited thereto. The two sub gate structures 70G are directly and electrically connected to the main gate structure 40G The main gate structure 40G and the two sub gate structures 70G may be used to formed one gate structure partly disposed between the two isolation structures 20 and partly disposed on the two isolation structures 20.

In addition, the high voltage semiconductor device 101 may further include two source/drain regions 60, a spacer 51, a contact etching stop layer 52, and an interlayer dielectric layer 53. The source/drain regions 60 are disposed in the semiconductor substrate 10 and disposed at outer ends of the two isolation structures 20 respectively. Specifically, the two source/drain regions 60 are disposed in the two drift regions 11 respectively, and the isolation structure 20 is disposed between the main gate structure 40G and one of the two source/drain regions 60 in the first direction D1. In some embodiments, the two source/drain regions 60 may be N-type doped regions when the semiconductor substrate 10 is a P-type semiconductor substrate or a semiconductor substrate including a P-type well and the drift regions 11 are N-type well regions, but not limited thereto. The spacer 51 may be disposed on sidewalls of the two sub gate structures 70G the contact etching stop layer 52 may be disposed on the main gate structure 40G the isolation structures 20, and the source/drain regions 60, and the interlayer dielectric layer 53 may be disposed on the contact etching stop layer 52, but not limited thereto.

Figure 3:
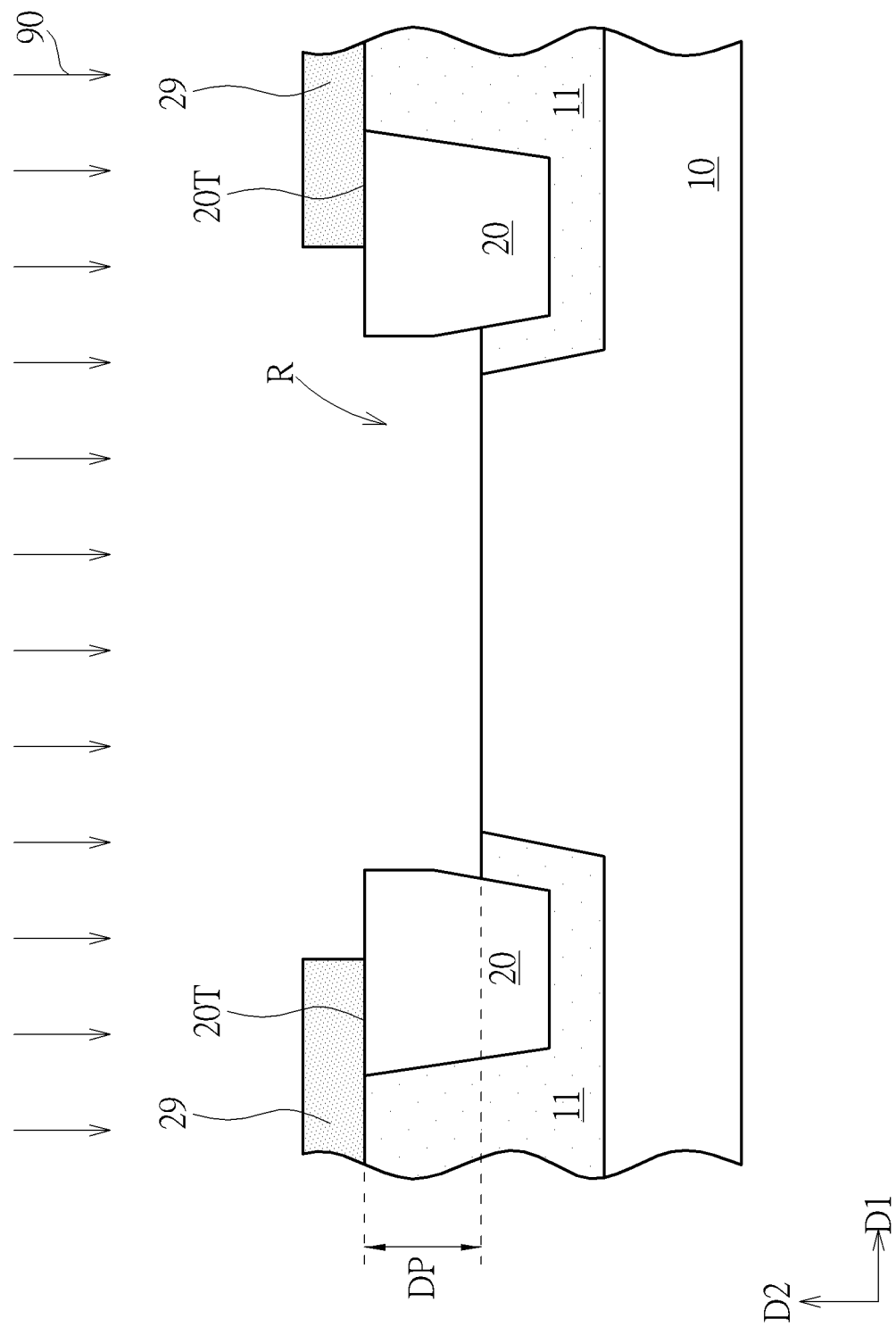

Please refer to FIGS. 1-7. FIGS. 2-7 are schematic drawings illustrating a manufacturing method of the high voltage semiconductor device according to the first embodiment of the present invention. It is worth noting that the manufacturing method of the high voltage semiconductor device 101 in this embodiment may include but is not limited to the following steps. As show in FIG. 2, the semiconductor substrate 10 is provided. The two isolation structures 20 are formed in the semiconductor substrate 10 and located in the two drift regions 11 respectively. The isolation structures 20 may include shallow trench isolation structures, and the topmost surface of each of the isolation structure 20 (such as the first top surface 20T) and a top surface of the semiconductor substrate 10 may be coplanar or the topmost surface of each of the isolation structure 20 may be slightly higher than the top surface of the semiconductor substrate 10, but not limited thereto. Subsequently, a patterned mask 29 is formed on the semiconductor substrate 10. The patterned mask 29 covers at least a part of each of the isolation structures 20, and the semiconductor substrate 10 between the two isolation structures 20 is exposed and not covered by the patterned mask 29. As shown in FIG. 3, a recess R is then formed in the semiconductor substrate 10. The recess R may be formed by a recessing process 90, such as an etching process, with the patterned mask 29 as a mask, but not limited thereto. The recessing process 90 may be an etching process having a higher etching selectivity between the semiconductor substrate 10 and the isolation structures 20 preferably. In other words, an etching rate of the semiconductor substrate 10 is higher than an etching rate of the isolation structures 20 in the recessing process 90. Accordingly, the isolation structures 20 may be kept from being damaged, the process window of the patterned mask 29 may become larger, and the recess R may be formed by a self-aligned approach.

Figure 4:
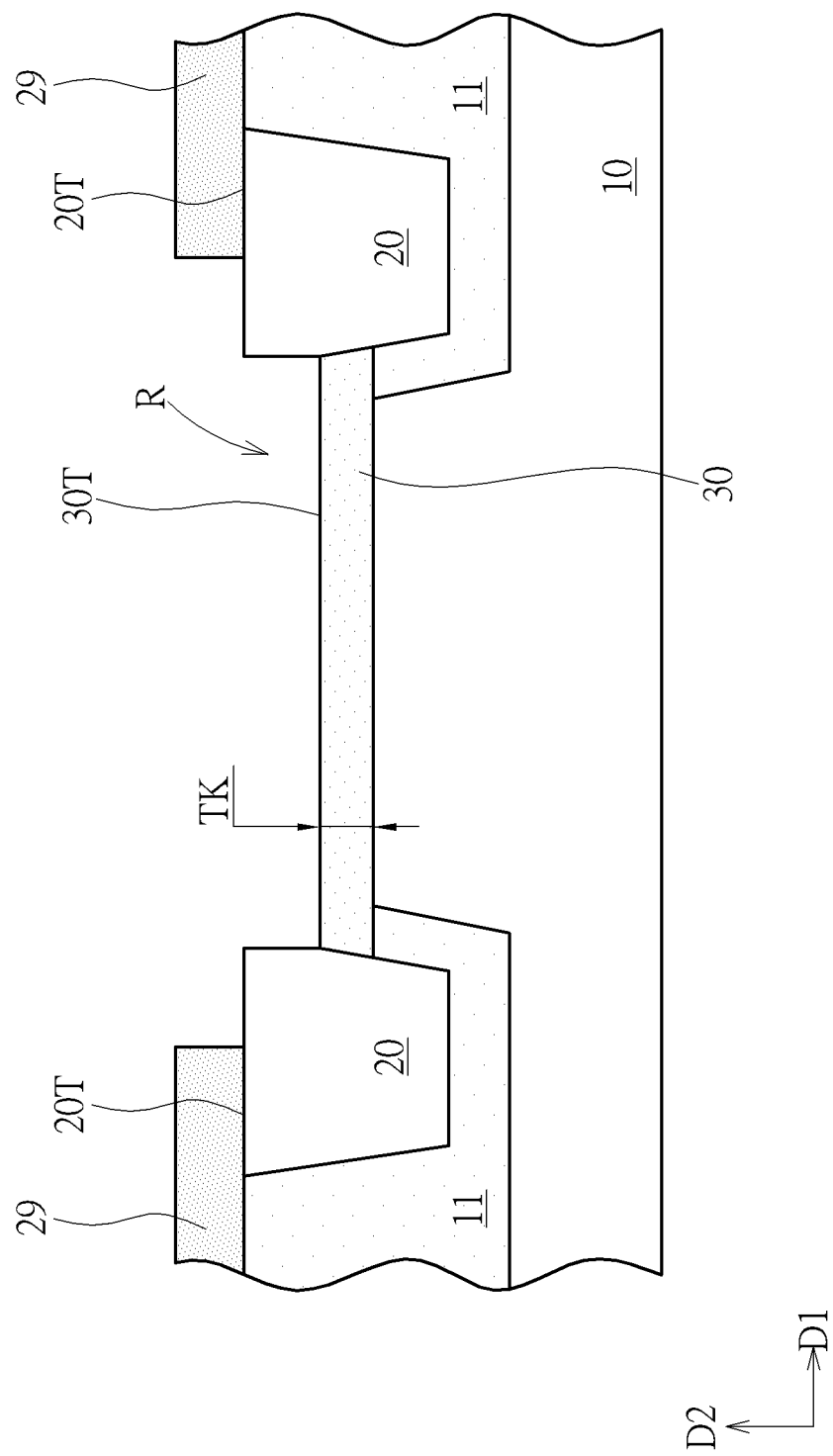

As shown in FIG. 3 and FIG. 4, the gate dielectric layer 30 is then formed in the recess R of the semiconductor substrate 10. The gate dielectric layer 30 may include an oxide layer, and the oxide layer may be formed by an oxidation treatment preferably, but not limited thereto. In some embodiments, the gate dielectric layer 30 may also be formed by other processes, such as a thin film deposition process, in accordance with other considerations. It is worth noting that the top surface of the gate dielectric layer 30 (such as the second top surface 30T shown in FIG. 4) is lower than the first top surface 20T of the isolation structure 20 in the second direction D2, and a depth DP of the recess R is larger than a thickness TK of the gate dielectric layer 30 preferably, but not limited thereto. For example, when the gate dielectric layer 30 is an oxide layer formed by an oxidation treatment, a part of the semiconductor substrate 10 is consumed for forming the gate dielectric layer 30. Accordingly, when the thickness TK of the gate dielectric layer 30 (about 1100 angstroms for example) is slightly larger than the depth DP of the recess R (about 1000 angstroms for example), and the gate dielectric layer 30 and the second top surface 30T may still be lower than the first top surfaces 20T of the isolation structures 20.

Figure 5:
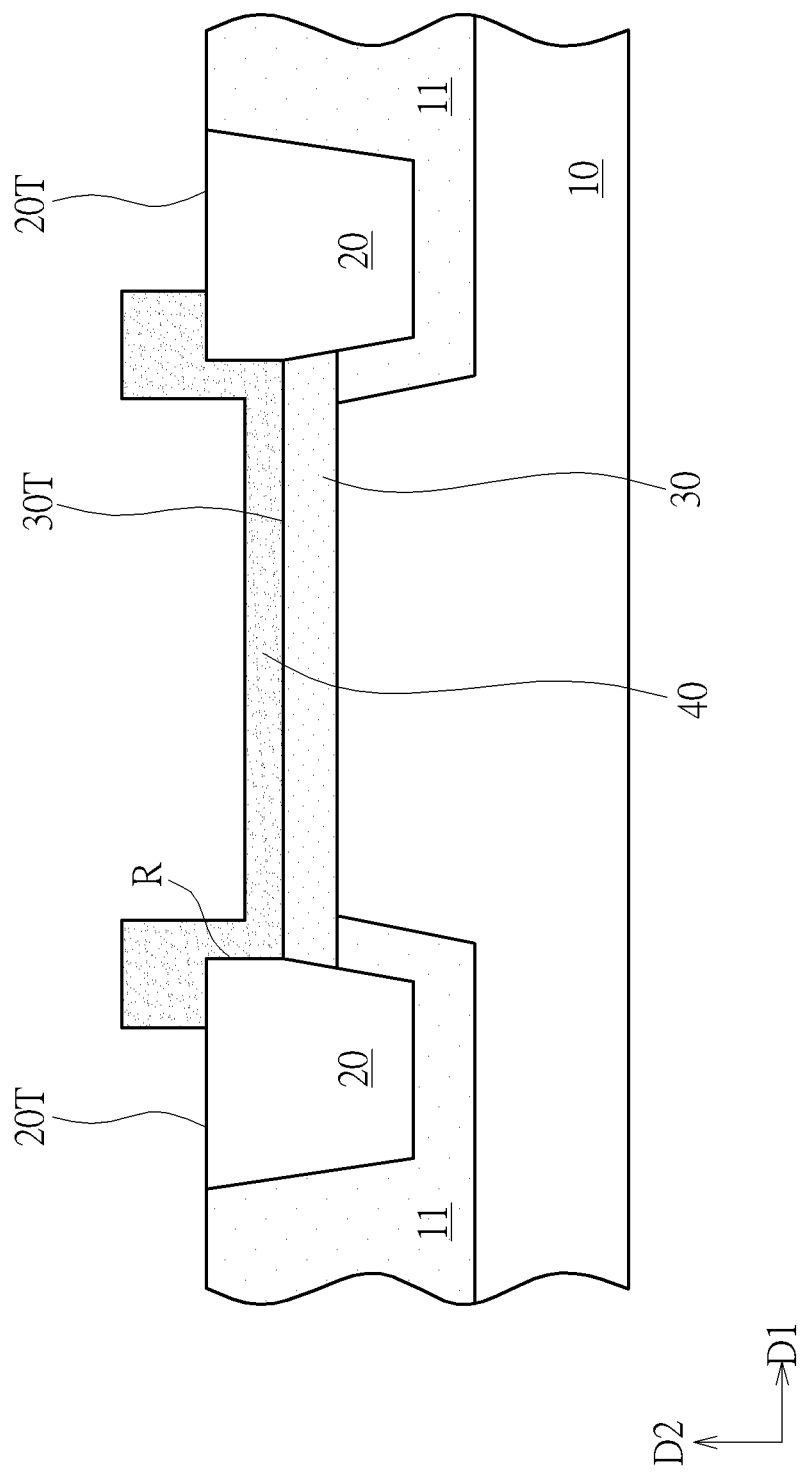
Figure 6:
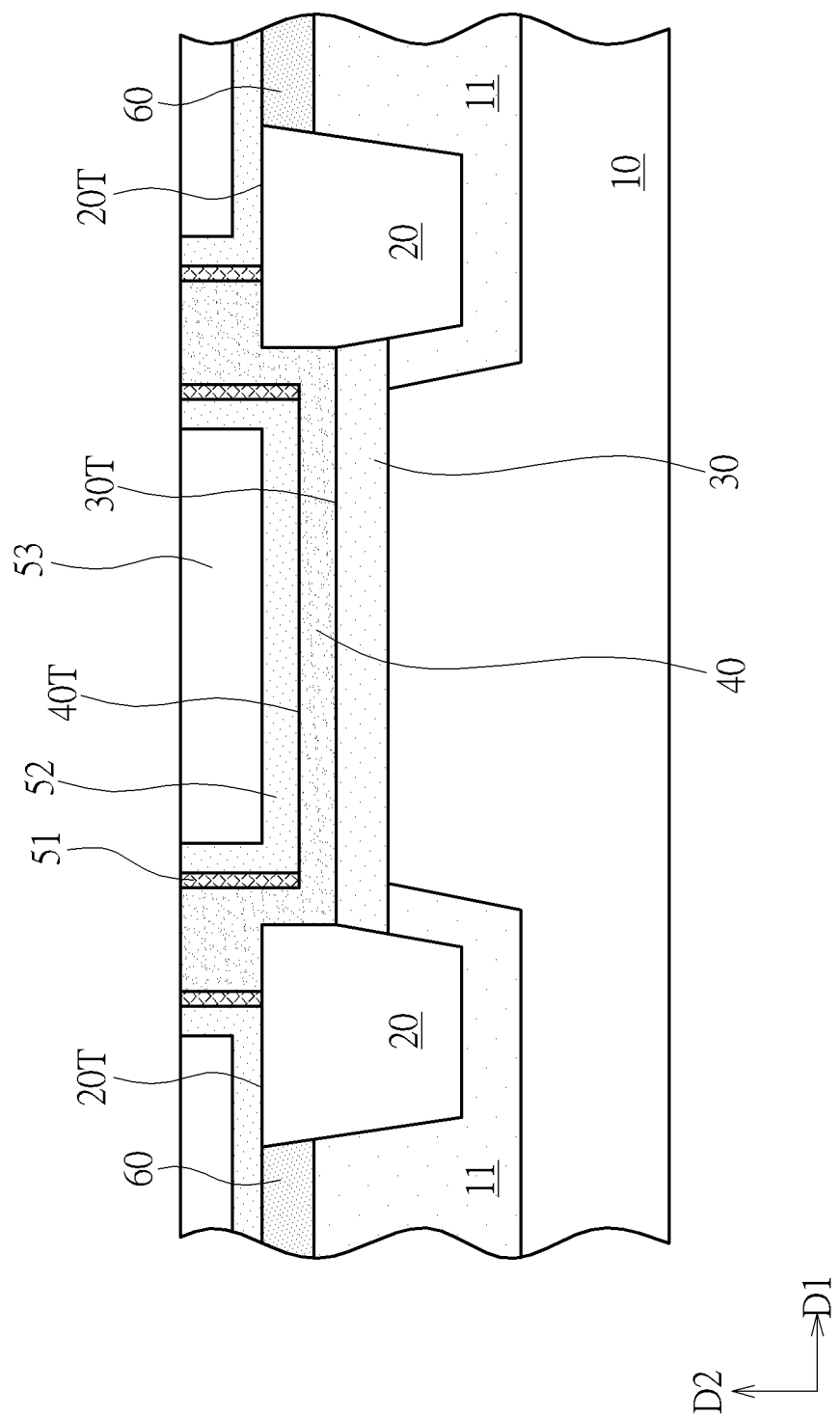
Figure 7:
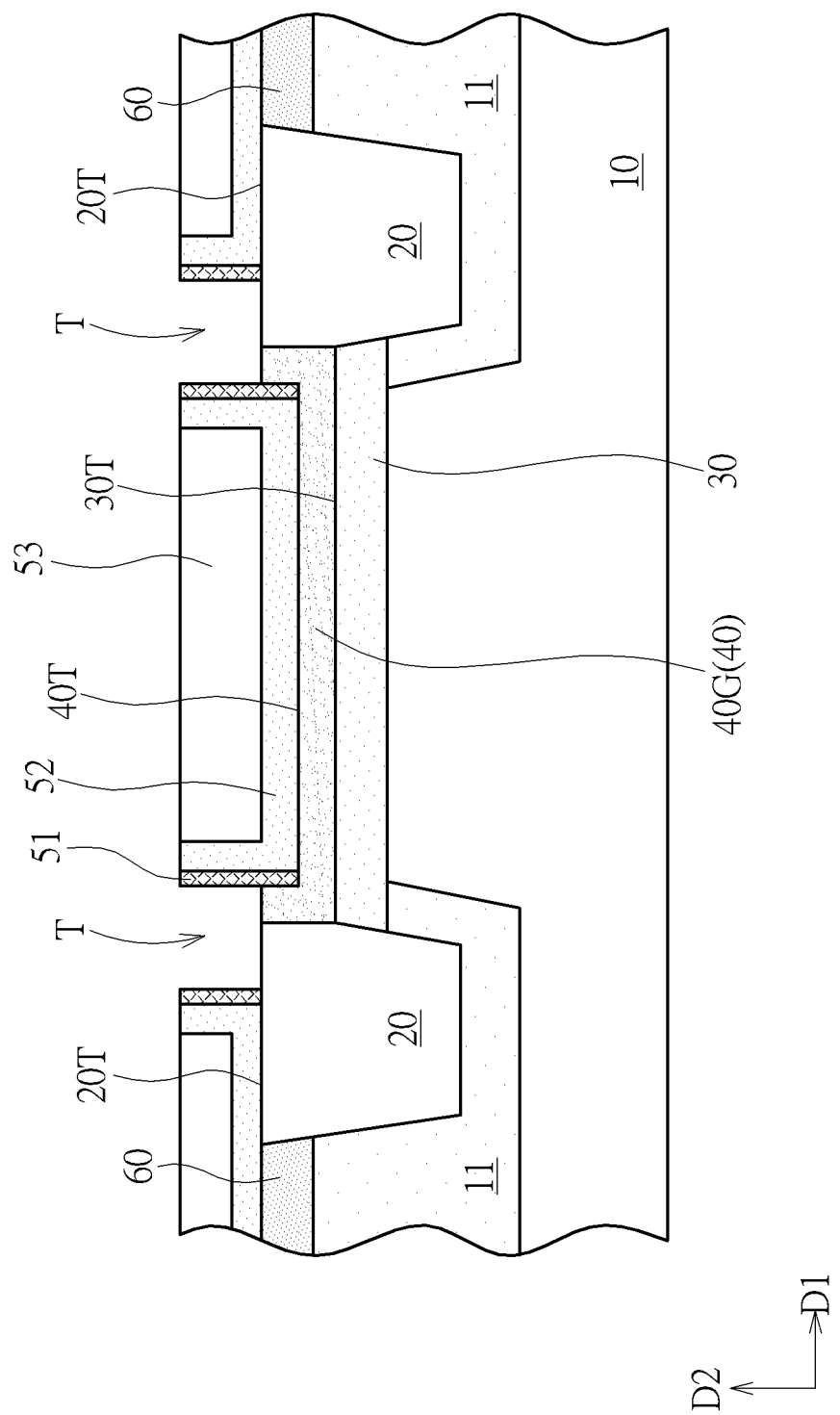

As shown in FIGS. 5-7, the main gate structure 40G is then formed on the gate dielectric layer 30, and the main gate structure 40G is lower than the first top surface 20T of each of the isolation structures 20. The manufacturing method of the main structure 40G may include but is not limited to the following steps. As shown in FIG. 5, a first gate material layer 40 is formed on the gate dielectric layer 30 and the two isolation structures 20. The materials of the first gate material layer 40 may include conductive doped polysilicon or other suitable conductive materials. For example, when the first gate material layer 40 is a polysilicon layer, the first gate material layer 40 may be formed by the process of forming polysilicon gates of other semiconductor devices (such as low voltage semiconductor devices in a logic region, not shown) and/or forming dummy gates (not shown) for a replacement metal gate (RMG) process, but not limited thereto. Subsequently, as shown in FIG. 6, an interlayer dielectric is formed on the first gate material layer 40 and the two isolation structures 20, and the interlayer dielectric may include the spacer 51, the contact etching stop layer 52, and the interlayer dielectric layer 53, but not limited thereto. Additionally, the source/drain regions 60 are formed in the drift regions 11 disposed at the outer sides of the two isolation structures 20.

As shown in FIG. 6 and FIG. 7, a part of the first gate material layer 40 on the two isolation structures 20 is removed for forming two trenches T in the interlayer dielectric (such as the spacer 51, the contact etching stop layer 52, and the interlayer dielectric layer 53 shown in FIG. 7) and forming the main gate structure 40G. At least a part of the top surface of the main gate structure 40G (such as the third top surface 40T shown in FIG. 7) is lower than the first top surface 20T of each of the isolation structures 20 in the second direction D2. Additionally, in some embodiments, a part of the isolation structures 20 disposed under the horizontal level of the first top surface 20T may be removed in the step of removing the part of the first gate material layer 40 for ensuring the formation of the trenches T, and any part of the main gate structure 40G is located under the horizontal level of the first top surfaces 20T of the isolation structures 20 in the second direction D2 accordingly, but not limited thereto.

As shown in FIG. 7 and FIG. 1, the two sub gate structures 70G are formed on two opposite ends of the main gate structure 40G Each of the sub gate structures 70S is partly formed on the main gate structure 40G and partly formed on one of the two isolation structures 20. In some embodiments, the two sub gate structures 70G may be formed by filling the trenches T with a second gate material layer 70, and the second gate material layer 70 may include a single layer or multiple layers of metal conductive materials. For example, the second gate material layer 70 may include a work function layer and a low resistivity layer. The work function layer mentioned above may include titanium nitride (TiN), titanium carbide (TiC), tantalum nitride (TaN), tantalum carbide (TaC), tungsten carbide (WC), titanium tri-aluminide (TiAl$_3$), or aluminum titanium nitride (TiAlN), but not limited thereto. The low resistivity layer mentioned above may include tungsten, aluminum, copper, titanium aluminide, titanium, or other suitable low resistivity materials. In other words, the material of the main gate structure 40G may be different from the material of the sub gate structures 70G For instance, the main gate structure 40G may include a polysilicon gate structure, and each of the sub gate structures 70G may include a metal gate structure.

According to the manufacturing method mention above, the method of forming the two sub gate structures 70G may be regarded as a replacement metal gate process. The sub gate structures 70 and metal gates of other semiconductor devices (such as the low voltage semiconductor devices in the logic region) may be formed by the replacement metal gate process together for process integration and process simplification, but not limited thereto. Specifically, the two sub gate structures 70S may be formed by filling the trenches T with the second gate material layer 70 and performing a chemical mechanical polishing (CMP) process for remove the excess part of the second gate material layer 70. In this embodiment, the gate structure of the high voltage semiconductor device 101 is composed of the main gate structure 40G and the two sub gate structures 70G and only the sub gate structures 70G are influenced by the chemical mechanical polishing process. The first length 40L of the main gate structure 40G may be adjusted in accordance with the requirement directly when the length of the gate structure of the high voltage semiconductor device 101 has become longer (such as longer than 2 micrometers, or even longer than 4 micrometers. The dishing issue in the chemical mechanical polishing process may be avoided when the chemical mechanical polishing process has to be performed to the second gate material layer 40 of the sub gate structures 40G because the second length 70L of each of the sub gate structures 70G may be relatively shorter. Additionally, the height of the gate structure of the high voltage semiconductor device101 (may be regarded as the height of the sub gate structure 70G) may still be substantially equal to the height of the metal gate structure of other semiconductor device when the gate dielectric layer 30 of the high voltage semiconductor device 101 has to become thicker for device electrical requirements because the main gate structure 40G and the gate dielectric layer 30 are formed in the recess of the semiconductor substrate 10 and are not higher than the top surface of the top surface of the isolation structure 20. Accordingly, the height difference between the high voltage semiconductor device and other semiconductor device may be reduced, the related manufacturing issues may be avoided, and the manufacturing yield may be improved.

Figure 8:
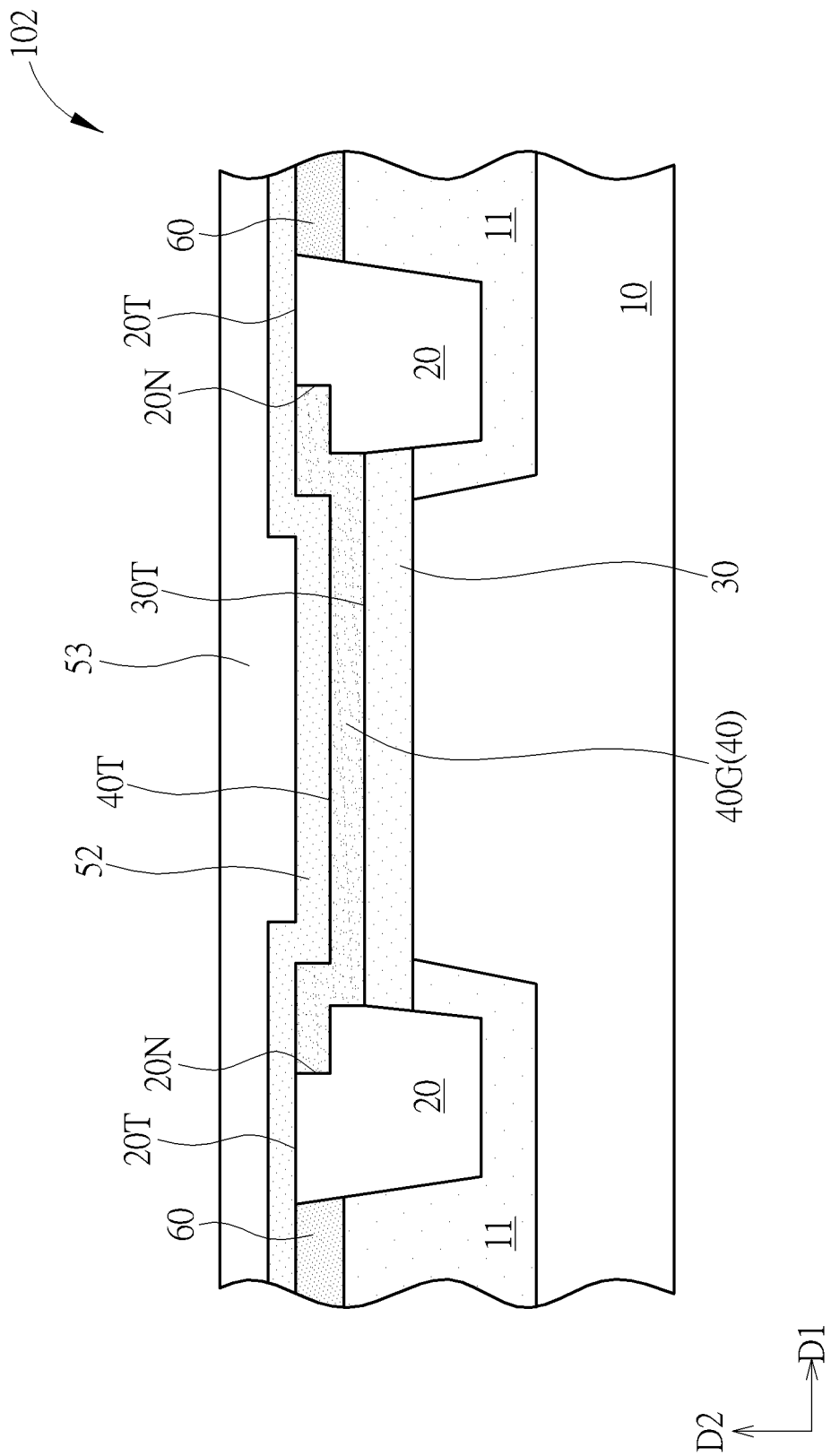
FIG. 8 is a schematic drawing illustrating a high voltage semiconductor device according to a second embodiment of the present invention.

Please refer to FIG. 8. FIG. 8 is a schematic drawing illustrating a high voltage semiconductor device according to a second embodiment of the present invention. As shown in FIG. 8, a high voltage semiconductor device 102 is provided in this embodiment. The high voltage semiconductor device 102 includes the semiconductor substrate 10, the two isolation structures 20, the gate dielectric layer 30, and the main gate structure 40G The two isolation structures 20 are disposed in the semiconductor substrate 10. The gate dielectric layer 30 is disposed between the two isolation structures 20, and the gate dielectric layer 30 is lower than a topmost surface of each of the isolation structures 20 (such as the first top surface 20T shown in FIG. 8). The main gate structure 40G is disposed on the gate dielectric layer 30 and the two isolation structures 20, and the main gate structure 40G is lower than the topmost surface of each of the isolation structures 20. The main gate structure 40G may include a polysilicon gate structure or a gate structure made of other suitable conductive materials. At least a part of a top surface of the main gate structure 40G (such as the third top surface 40T shown in FIG. 8) is lower than the topmost surface of each of the isolation structures 20 (such as the first top surface 20T).

The difference between the high voltage semiconductor device 102 and the high voltage semiconductor device of the first embodiment mentioned above is that the gate structure of the high voltage semiconductor device 102 may be composed of the main gate structure 40G without the sub gate structure described in the above-mentioned first embodiment. Additionally, in the processes of forming the recess (not shown in FIG. 8) in the semiconductor substrate 10 and forming the gate dielectric layer 30 in the recess (similar to the above-mentioned conditions shown in FIG. 3 and FIG. 4), two notches 20N may be formed at a side of each of the two isolation structures adjacent to the recess by modifying the etching selectivity of the recessing process. Therefore, the main gate structure 40G subsequently formed may be partially formed in the notches 20N of the two isolation structures 20 for being partly disposed on the two isolation structures 20, and any part of the main gate structure 40G (including the topmost surface of the main gate structure 40G) may be still located under the horizontal level of the topmost surface of each of the isolation structures 20 in the second direction D2. In addition, the high voltage semiconductor device 102 may further include the contact etching stop layer 52, the interlayer dielectric layer 53, and the two source/drain regions 60. The two source/drain regions are disposed in the semiconductor substrate 10 and disposed at the outer ends of the two isolation structures 20 respectively. The contact etching stop layer 52 is disposed on the source/drain regions 60, the isolation structures 20, and the main gate structure 40G The interlayer dielectric layer 53 is disposed on the contact etching stop layer 52.

The manufacturing process, such as the replacement metal gate process, of other semiconductor devices will not be influenced by the gate structure of the high voltage semiconductor device 102 when the gate dielectric layer 30 has to become thicker for electrical requirements because the gate structure of the high voltage semiconductor device 102 in this embodiment may be composed of the main gate structure 40G only and the main gate structure 40G is lower than the topmost surfaces of the isolation structures 20. It is helpful for integrating and simplifying the manufacturing processes of different types of semiconductor devices. In addition, the first length 40L of the main gate structure 40G may be adjusted in accordance with the requirement directly when the length of the gate structure of the high voltage semiconductor device 102 has become longer (such as longer than 2 micrometers, or even longer than 4 micrometers because the main gate structure 40 may be a polysilicon gate structure and the dishing issue is not significant in the chemical mechanical polishing process performed on the polysilicon material.

To summarize the above descriptions, according to the high voltage semiconductor device and the manufacturing method thereof in the present invention, the main gate structure may be lower than the top surface of the isolation structure in the semiconductor structure by forming the recess in the semiconductor structure and forming the gate dielectric layer and the main gate structure in the recess. The height difference between other semiconductor devices and the high voltage semiconductor device with thicker gate dielectric layer may be reduced, the related manufacturing issues may be avoided, and the manufacturing yield may be enhanced accordingly. Additionally, the manufacturing method of the high voltage semiconductor device in the present invention may be integrated with the manufacturing processes of other semiconductor devices (such as low voltage semiconductor devices) for simplifying the manufacturing processes and lowering the production costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a high voltage semiconductor device, comprising:
    providing a semiconductor substrate, wherein two isolation structures are formed in the semiconductor substrate;
    forming a recess in the semiconductor substrate;
    forming a gate dielectric layer in the recess of the semiconductor substrate;
    forming a main gate structure on the gate dielectric layer, wherein at least a part of a top surface of the main gate structure is lower than a top surface of each of the two isolation structures; and
    forming two sub gate structures on two opposite ends of the main gate structure, wherein each of the two sub gate structures is partly formed on the main gate structure and partly formed on one of the two isolation structures, and the two sub gate structures are directly connected to the main gate structure.

2. The method of claim 1, wherein a depth of the recess is larger than a thickness of the gate dielectric layer.

3. The method of claim 1, wherein the main gate structure comprises a polysilicon gate structure.

4. The method of claim 1, wherein a material of the main gate structure is different from a material of the two sub gate structures.

5. The method of claim 1, wherein the main gate structure comprises a polysilicon gate structure, and each of the two sub gate structures comprises a metal gate structure.

6. The method of claim 1, wherein the two sub gate structures are formed by a replacement metal gate process.

7. The method of claim 6, wherein steps of forming the main gate structure comprising:
- forming a first gate material layer on the gate dielectric layer and the two isolation structures;
- forming an interlayer dielectric on the first gate material layer and the two isolation structures; and
- removing a part of the first gate material layer on the two isolation structures for forming two trenches in the interlayer dielectric, wherein the two sub gate structures are formed by filling the trenches with a second gate material layer.

* * * * *